United States Patent
Merk

(10) Patent No.: US 7,770,081 B2
(45) Date of Patent: Aug. 3, 2010

(54) INTERFACE CIRCUIT FOR A SINGLE LOGIC INPUT PIN OF AN ELECTRONIC SYSTEM

(75) Inventor: Dieter Merk, Freising (DE)

(73) Assignee: Texas Instruments Deutschland GmbH, Freising (DE)

( * ) Notice: Subject to any disclaimer, the term of this patent is extended or adjusted under 35 U.S.C. 154(b) by 158 days.

(21) Appl. No.: 11/095,283

(22) Filed: Mar. 31, 2005

(65) Prior Publication Data

US 2005/0229055 A1 Oct. 13, 2005

(30) Foreign Application Priority Data

Apr. 2, 2004 (DE) .................... 10 2004 016 387

(51) Int. Cl.
*G01R 31/28* (2006.01)

(52) U.S. Cl. .............. 714/724; 714/39; 714/709; 714/718; 714/726; 714/733; 714/734; 324/76.47; 257/48; 377/19

(58) Field of Classification Search ........................ None
See application file for complete search history.

(56) References Cited

U.S. PATENT DOCUMENTS

| | | | | |
|---|---|---|---|---|
| 5,894,548 A | * | 4/1999 | Horie | 714/30 |
| 5,994,915 A | * | 11/1999 | Farnworth et al. | 324/765 |
| 6,314,537 B1 | * | 11/2001 | Oh | 714/718 |
| 6,321,354 B1 | * | 11/2001 | Prunier | 714/726 |
| 6,424,168 B1 | * | 7/2002 | Farnworth et al. | 324/765 |
| 6,617,610 B2 | * | 9/2003 | Kanetani et al. | 257/48 |
| 6,657,451 B2 | * | 12/2003 | Meli | 324/765 |
| 6,888,765 B1 | * | 5/2005 | Kotowski et al. | 365/201 |
| 2002/0097616 A1 | * | 7/2002 | Schneider et al. | 365/200 |
| 2003/0178692 A1 | * | 9/2003 | Farnworth et al. | 257/499 |
| 2004/0210805 A1 | * | 10/2004 | Kimelman et al. | 714/724 |
| 2006/0087307 A1 | * | 4/2006 | De Winter | 324/76.47 |

FOREIGN PATENT DOCUMENTS

| DE | 10102871 A1 | 8/2002 |
|---|---|---|
| EP | 1157278 B1 | * 11/2001 |

* cited by examiner

*Primary Examiner*—John P Trimmings
(74) *Attorney, Agent, or Firm*—John J. Patti; Wade J. Brady, III; Frederick J. Telecky, Jr.

(57) ABSTRACT

An interface circuit for a single logic input pin of an electronic system, comprising a decoder for converting a pulse coded signal applied to said pin to a sequence of logic low and logic high values, and a state machine responsive to said sequence of logic values to switch the electronic system between different modes of operation.

6 Claims, 3 Drawing Sheets

INTERFACE CIRCUIT FOR A SINGLE LOGIC INPUT PIN OF AN ELECTRONIC SYSTEM

CROSS REFERENCE TO RELATED APPLICATIONS

This application claims priority under 35 USC §119 of German Application Serial No. 10 2004 016367.1, filed Apr. 2, 2004.

FIELD OF THE INVENTION

The present invention relates to an interface circuit for a single logic input pin of an electronic system.

BACKGROUND OF THE INVENTION

Small electronic systems may have a single input pin for accepting serial data from the environment. Programming and testing of such systems after manufacture would require additional dedicated pins, as would also be the case if switching of the system to a power-saving disabled mode, to a test mode or to a select mode, was a requirement.

SUMMARY OF THE INVENTION

The present invention provides an interface circuit that permits multiple use of a single input pin of an electronic system.

Specifically, the invention provides an interface circuit for a single logic input pin of an electronic system. The interface circuit comprises a decoder for converting a pulse coded signal applied to the input pin into a sequence of logic low and logic high values. The interface circuit also includes a state machine responsive to the sequence of logic values to switch the electronic system between different modes of operation. Depending on the selected mode of operation, the single input pin will function as one out of several separate (logic) input channels. Accordingly, the single input pin of a small electronic system can be used in multiple ways. Since the pulse coded signal may define an unlimited number of different logic high/low sequences, i.e. bit patterns, each corresponding to a particular state of the state machine, the number of uses for the single input pin is virtually infinite.

In a specific embodiment, the small electronic system has an enable/disable input that can be selectively used as a programming input. In a development of this concept, the single input pin can be selectively used for switching the electronic system into a test mode. Alternatively, the input pin with multiuse functionality may be a select input, or any other input that does not require a permanent dedication.

In the preferred embodiment of the invention, the decoder includes delay means for delaying the applied pulse coded signal by a fixed fraction of its period and sampling means for sampling the non-delayed pulse coded signal at positions in time corresponding to a change of state in a predetermined sense of the delayed pulse coded signal. Thus, when the pulse coded signal at the time of sampling has a low value, it is decoded into a bit "0", and a high value would be decoded into a bit "1".

DETAILED DESCRIPTION OF THE DRAWINGS

Figure 1:
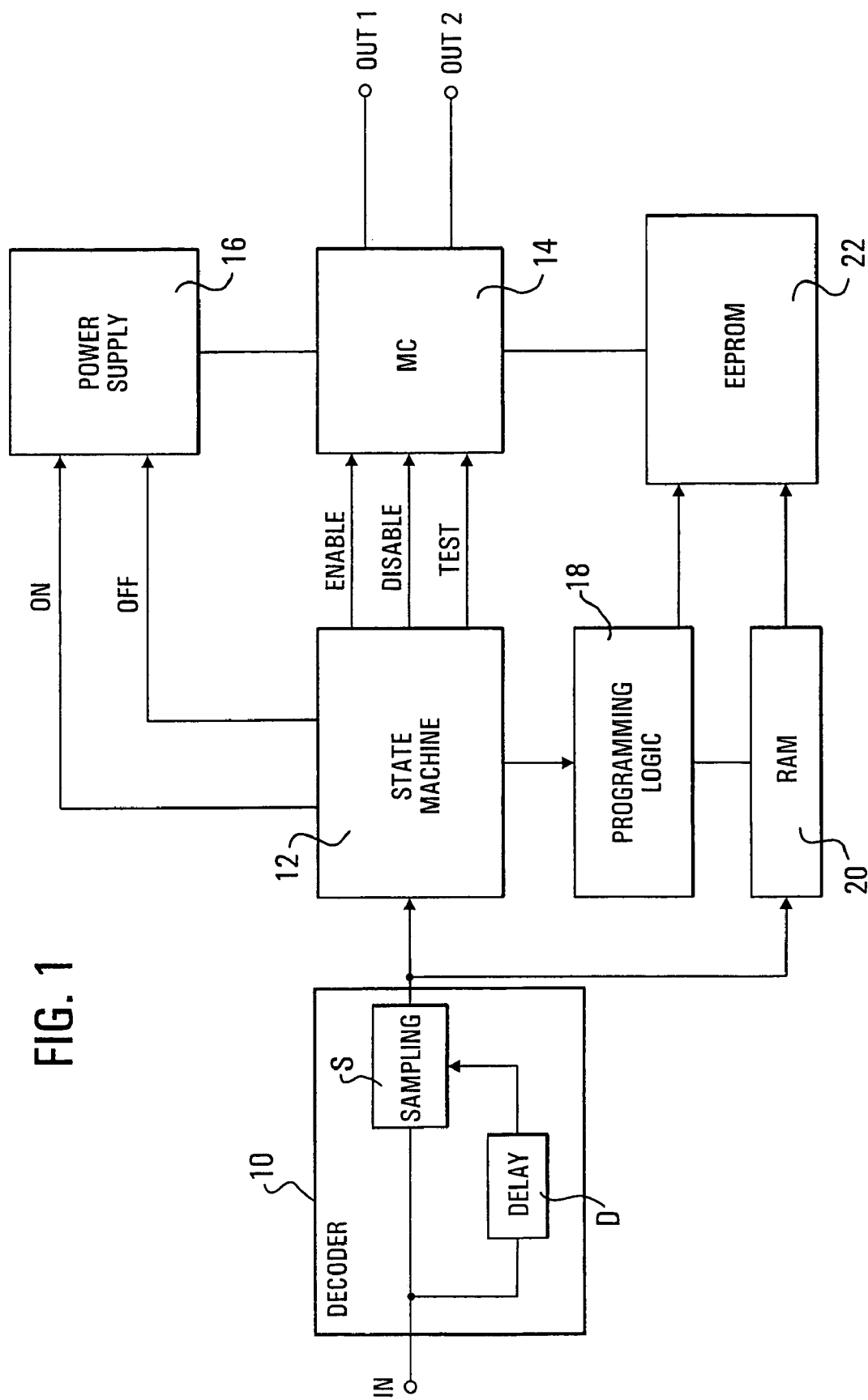
FIG. 1 is a block diagram of a small electronic system with a single input pin.

With reference to FIG. 1, a small electronic system is shown wherein the inventive interface circuit is implemented. The system includes a decoder 10 that is connected to an input pin IN and a state machine 12 that receives an output from decoder 10. The output of decoder 10 is a sequence of logic low and logic high values. FIG. 1 also shows other parts of an electronic system that are essential to understand the invention. In the embodiment shown, these comprise a micro-controller 14. Of course, other circuitry such as a clock processing arrangement could be included instead. In this example, the micro-controller 14 receives commands from state machine 12; these commands may include ENABLE, DISABLE and TEST. Micro-controller 14 has e.g. two outputs OUT 1 and OUT 2. Furthermore, there is a power supply 16 connected to micro-controller 14 and which also receives commands from state machine 12. These commands may include ON and OFF. A programming logic 18 is connected with its input to state machine 12 and outputs to two memories, a register RAM 20 (Random Access Memory) and a programmable memory EEPROM 22 (Electrically Erasable Programmable Read Only Memory). RAM 20 also receives the decoded signals from decoder 10.

State machine 12 assumes different states in accordance with predetermined patterns of logic low and logic high values. In each of the different states, state machine 12 provides a different command on its outputs.

In a normal operation mode of the electronic system, input pin IN receives a constant logical "1" as an enable signal for micro-controller 14. Accordingly, state machine 12 assumes "State1". When a predetermined pulse coded signal EN is applied to input pin IN, state machine 12 will toggle to another state and thus switch the electronic system between different modes of operation. Input pin IN can then, according to the state of state machine 12, be used for example for programming EEPROM 22, for disabling all current sources or for entering a test mode.

Figure 2:
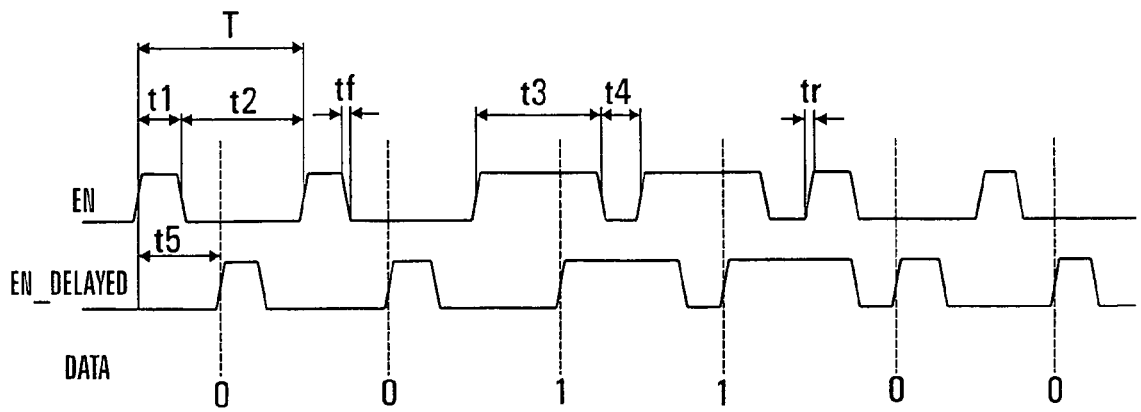
FIG. 2 is a signal diagram illustrating decoding of a pulse coded input signal.

With reference to FIG. 2, the function of decoder 10 will be explained in more detail. Decoder 10 includes a fixed delay circuit D and a sampler S The binary information contained in pulse coded signal EN is coded into pulses of long duration for a logical "1" and into pulses of short duration for a logical "0". The pulse sequence EN has a period T and is pulse coded with short pulses of a duration t1 and long pulses with a duration t3. Time periods t2 and t4 designate the remaining time of period T with no pulses. Delay circuit D delays the pulse coded signal EN by a fixed fraction of period T, the duration of the delay is indicated in FIG. 2 as delay time t5. Delay time t5 must be longer than the duration t1 of the short pulses and shorter than the duration t3 of the long pulses.

$$t1 < t5 < t3$$

The delayed signal EN_DELAYED is used by sampler S as a clock to sample pulse coded signal EN. In FIG. 2 each rising edge of the delayed pulse coded signal EN_DELAYED is used to sample signal EN. As indicated by the dashed lines a low value is detected for a short pulse and a high value for a long pulse. So the exemplary data decoded from pulse coded signal EN as represented in FIG. 2, is "001100".

Figure 3:
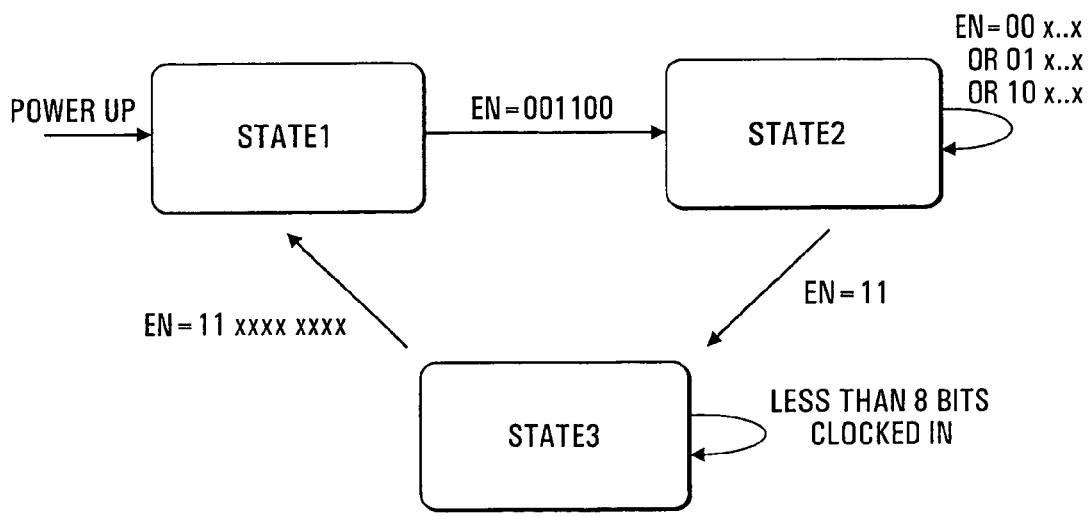
FIG. 3 is a schematic representation of states assumed by a state machine.

The function of state machine 12 will now be explained in more detail with reference to FIG. 3. A state machine with three different states is considered, each state is symbolized by a different block. Arrows indicate the change from one state to another. On "power up", state machine 12 enters "State1" which signifies normal, usual operation with a constant output command "1" with which state machine 12 enables micro-controller 14.

If a pulse coded signal EN is applied to input pin IN as the one shown in FIG. 2, with two short, two long and again two short pulses, which are decoded to "001100", state machine 12 changes to its "State2". This is indicated by an arrow in FIG. 3. Of course any other bit pattern could be defined to change to "State2".

Once switched to "State2", state machine 12 will wait for predetermined instructions or a predetermined bit pattern: the first two bit positions are representative of a memory address in register RAM 20: "00" indicates "write to Word 0", "01" indicates "write to Word 1" and "10" indicates "write to Word 2". The eight following bit positions are representative of programming data, they are the payload or the information to be written to the address indicated. If in a specified timing no bits are sent to state machine 12, or not in the specified order, a time out will occur.

After writing of the programming data into RAM 20 a concluding step will be started by a bit sequence of "11", in which the programming data will be written from register RAM 20 to programmable memory EEPROM 22. An arrow with EN=11 in FIG. 3 shows the change from "State2" to "State3". After eight further bits have been clocked in, state machine 12 returns to "State1".

Figure 4:
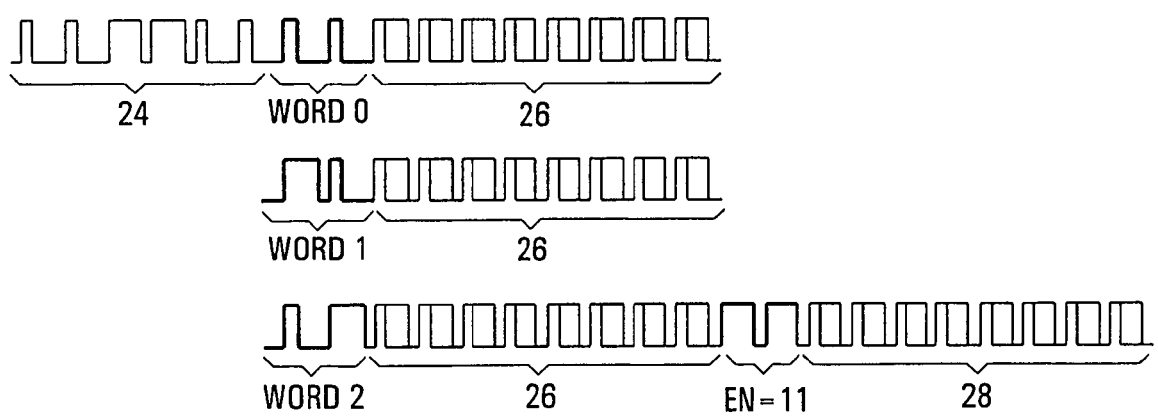
FIG. 4 is a signal diagram illustrating a typical programming cycle.

FIG. 4 visualizes the corresponding pulse sequence entering at input pin IN. Pulses 24 shown in the first line of FIG. 4 are six pulses which will be decoded by decoder 10 to a bit pattern "001100", thus changing state machine 12 to "State2". These six pulses are followed by two pulses indicative of the address. Pulse sequence 24 may be followed by two short pulses indicating Word 0 or by a long and then a short pulse to indicate Word 1 or by a short and then a long pulse to indicate the address of Word 2.

As the first pulse received will be read in first in the address register on the least significant bit, the representation as a pulse sequence is not in the same order as the bit pattern. A short pulse (decoded as "0") followed by a long pulse (decoded as "1") equals address "10" for Word 2. The two pulses representing the two address bits are followed by the eight pulses which represent the eight bits of payload 26. Of course, these may be long or short pulses corresponding to the programming data 26. This is symbolized in FIG. 4 by a superposition of long and short pulses. In the last line of FIG. 4, the pulse sequence is continued by two long pulses (EN=11), decoded as "11" and changing state machine 12 to "State3". They are followed by eight dummy pulses 28, which determine the timing for the writing operation in programmable memory EEPROM 22. After the data have been transferred from RAM 20 to EEPROM 22 and written therein, and the eight dummy pulses have been clocked in, "State3" returns to "State1".

By incorporating the inventive interface circuit into the small electronic system as disclosed, the same input pin IN can be used for multiple purposes by applying a pulse coded signal to identify a specific functionality for that pin so that, e.g. an enable input or a select input may be alternatively used for in-circuit programming the electronic system. The multiuse functionality of such input pin is not visible from outside of a given product, so that the inventive multiuse functionality of an input pin may be provided as an option.

The invention claimed is:

1. An interface circuit for a single logic input pin of an electronic system comprising:
    a decoder for converting a pulse coded signal applied to said pin to a sequence of logic low and logic high values; and
    a state machine responsive to said sequence of logic values to switch the electronic system between different modes of operation, wherein the different modes of operation comprise at least two of the group consisting of enabled mode, disabled mode, programming mode, select mode, and test mode, and wherein the programming mode includes converting the sequence of logic low and logic high values into bit patterns wherein predetermined bit positions are representative of a memory address and remaining bit positions are representative of programming data.

2. The interface circuit according to claim 1, wherein the decoder includes delay means for delaying the applied pulse coded signal by a fixed fraction of its period and sampling means for sampling the non-delayed pulse coded signal at positions in time corresponding to a change of state in a predetermined sense of the delayed pulse coded signal.

3. The interface circuit of claim 1, wherein the pulse coded signal consists of a long pulse for a logical "1" and of a short pulse for a logical "0".

4. The interface circuit according to claim 1, wherein the non-delayed pulse coded signal is sampled at each rising edge of the delayed pulse coded signal.

5. The interface circuit according to claim 1, wherein the electronic system comprises a programmable memory and a register, the programming mode including converting the sequence of logic low and logic high values into bit patterns wherein the predetermined bit positions are representative of a register address and remaining bit positions are representative of the programming data, and the programming mode including a concluding step of writing the programming data from the register to the programmable memory.

6. The interface circuit according to claim 1, wherein the disabled mode includes switching-off at least one power supply of the electronic system.

* * * * *